United States Patent
Bryant et al.

(10) Patent No.: US 6,400,171 B2
(45) Date of Patent: *Jun. 4, 2002

(54) METHOD AND SYSTEM FOR PROCESSING INTEGRATED CIRCUITS

(75) Inventors: Andres Bryant; William Clark; Edward J. Nowak; Minh Tong, all of Essex Junction, VT (US)

(73) Assignee: International Business Machines Corp., Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/273,895

(22) Filed: Mar. 22, 1999

(51) Int. Cl.[7] .............................................. G01R 31/28
(52) U.S. Cl. ...................................... 324/763; 324/765
(58) Field of Search ............................ 324/158.1, 73.1, 324/765, 763, 760; 714/733, 724; 257/40, 48; 438/14, 17; 327/546, 538, 78; 365/201

(56) References Cited

U.S. PATENT DOCUMENTS

| | | | |
|---|---|---|---|
| 4,743,841 A | * 5/1988 | Takeuchi | 324/763 |
| 5,294,883 A | 3/1994 | Akiki et al. | |
| 5,349,290 A | * 9/1994 | Yamada | 324/158.1 |
| 5,448,199 A | * 9/1995 | Park | 327/546 |
| 5,497,117 A | * 3/1996 | Nakajima et al. | 327/404 |
| 5,570,034 A | 10/1996 | Needham et al. | |
| 5,644,251 A | 7/1997 | Colwell et al. | |
| 5,652,524 A | 7/1997 | Jennion et al. | |
| 5,670,890 A | 9/1997 | Colwell et al. | |
| 5,721,495 A | 2/1998 | Jennion et al. | |
| 5,732,032 A | * 3/1998 | Park et al. | 365/201 |
| 5,745,499 A | * 4/1998 | Ong | 365/189.09 |

* cited by examiner

Primary Examiner—Vinh P. Nguyen
(74) Attorney, Agent, or Firm—Scully, Scott, Murphy & Presser; Mark F. Chadurjian, Esq.

(57) ABSTRACT

A circuit and a method for automatically detecting an operating condition of an integrated circuit chip and for automatically outputting a control signal in response to automatically detecting one of at least two said operating conditions. With the preferred embodiment, FET off currents are reduced during burn-in of a CMOS integrated chip. This is done by a compact, local sensing circuit. The sensing circuit is off during the normal chip operation, and the sensing circuit is only used where needed to provide a local signal to cut down excessive FET off currents. The sensing circuit preferred embodiment is designed with an NFET bandgap device that employs a novel layout approach.

12 Claims, 12 Drawing Sheets

NFET I-V Characteristics

Bandgap PFET layout

Standard PFET layout

Bandgap low-Vt NFET layout

Standard low-Vt NFET layout

Low-Vt NFET I-V Characteristics

Bandgap Buried-channel PFET layout

Standard Buried-channel PFET layout

FIG. 12

METHOD AND SYSTEM FOR PROCESSING INTEGRATED CIRCUITS

BACKGROUND OF THE INVENTION

This invention generally relates to semiconductor integrated circuits, and more particularly, the invention relates to procedures for detecting defects and faults in such circuits.

Integrated circuits typically incorporate a very high density of circuit components, most of which are susceptible to a variety of faults and physical defects. Many of these faults arise during manufacture of the integrated circuits. For this reason, it is necessary to test these circuits, and a variety of tests are known and used.

One technique commonly used to detect circuit faults in Complementary Metal Oxide Semiconductor (CMOS) integrated circuits is a procedure referred to as the IDD current test or the IDDQ test. This test attempts to measure the quiescent current of a chip between supply voltage, VDD, and ground potential GND. Generally, IDDQ testing is based upon the fact that absent any internal faults, the quiescent VDD supply current in a typical CMOS integrated circuit is on the order of less than 100 nanoamps. A physical defect such as bridging will produce a measurable increase in quiescent supply current. With IDDQ testing, a high level of defect coverage can be obtained with a minimal test time.

To help detect defects in chips with high resistance caused leakage problems, a procedure referred to as burn-in is often used as an acceleration technique. Burn-in is a method used to accelerate failures in a device if there is a weak feature or defect that is sensitive to extended operation of the device. Defects such as weak oxides, narrow silicon or metal lines, small resistive contacts, or other similar flaws usually become more apparent with burn-in and are therefore more readily identified during testing.

One of the main problems facing product burn-in is the high standby IDDQ current. Any circuit with known high source of IDD current such as bipolar circuit or FETS with high off current will mask defect-induced current and/or lower chip burn-in throughput. For example, at burn-in conditions, the FET off currents increase significantly due to lower threshold voltages (Vt) at high temperature, resulting in high IDDQ. Unless these currents can be kept reasonably low, burn-in is less effective and more expensive. Prior art efforts to address this problem have several drawbacks. For example, with one approach, an external control signal has to be applied and chip space is taken for global wiring and external pins.

SUMMARY OF THE INVENTION

An object of this invention is to reduce high currents that are not defect-related during burn-in of a CMOS integrated circuit.

Another object of the present invention is to provide a procedure for reducing currents during burn-in of a CMOS integrated circuit that does not require any external pin on the chip or any external control signal applied to the chip.

Another object of the present invention is to provide a procedure for reducing noise generation or increasing noise immunity of circuits during burn-in.

Another object of the present invention is to use an on-chip circuit to reduce currents during burn-in of a CMOS integrate circuit.

These and other objectives are attained with a circuit and a method for automatically detecting an operating condition of an integrated circuit chip and for automatically outputting a control signal in response to automatically detecting one of at least two said operating conditions.

With the preferred embodiment of the invention, FET off currents are reduced during burn-in of a CMOS integrated chip. This is done by a compact, local sensing circuit. The sensing circuit is off during the normal chip operation, and the sensing circuit is only used where needed to provide a local signal to cut down excessive FET off currents.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
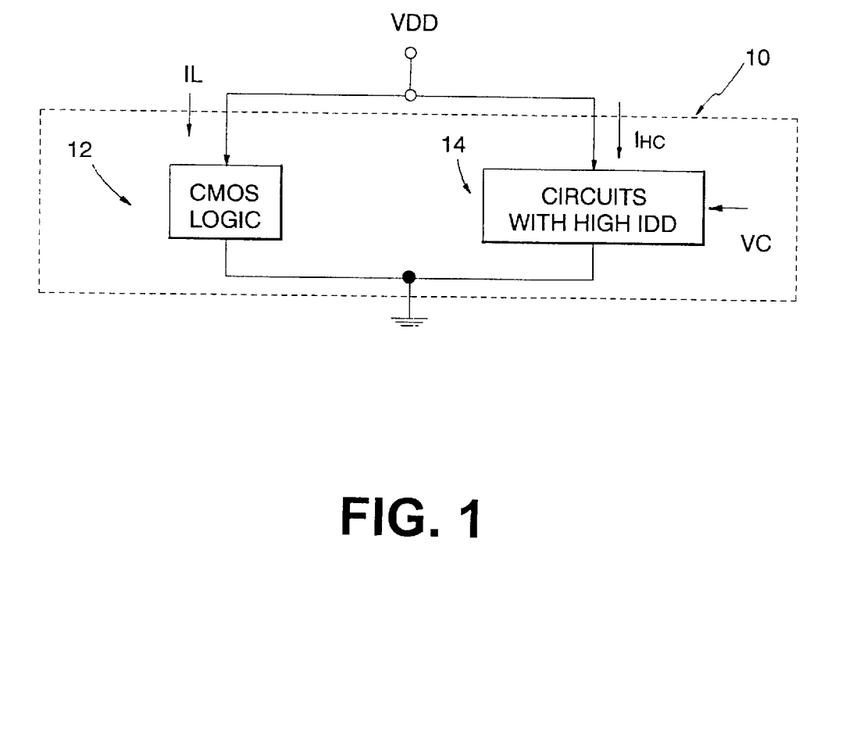
FIG. 1 is a block diagram of an integrated circuit embodying the invention.

FIG. 1 generally depicts a CMOS circuit 10 including a CMOS logic portion 12 and a circuit portion 14 that has high standby current. CMOS logic 12 and circuit portion 14 are coupled in parallel between a common voltage supply rail VDD and a ground voltage GND.

Since both logic 12 and circuit portion 14 share a common power drive (VDD), current flow from VDD to ground branches as a logic current component IL through CMOS logic 12 and a high current component $I_{HC}$ through circuit portion 14.

IDD current testing attempts to measure quiescent current of a chip's logic between supply voltage VDD and ground. To facilitate this test, it is desirable to shut off current through circuit 14 during testing via the signal $V_c$, since this current would mask the very low IDD current in the parallel connected logic 12 of integrated circuit 10.

The high current $I_{HC}$ is reduced during burn-in by a compact, local sensing circuit 20. This sensing circuit is off during the normal chip operation, and the circuit is only used where needed to provide a local signal $V_C$ to cut down excessive FET off currents One suitable sensing circuit 20 is shown in detail in FIG. 2. For illustration purposes, VDD is selected to be 1.5 V (for example IBM CMOS8S technology). The circuit comprises a small asymmetrical latch (T1-T4) where the T4 NFET is designed to be "bigger" than T3 to preset the latch output OUT to a low state whenever it is powered up during normal operation.

Figure 2:
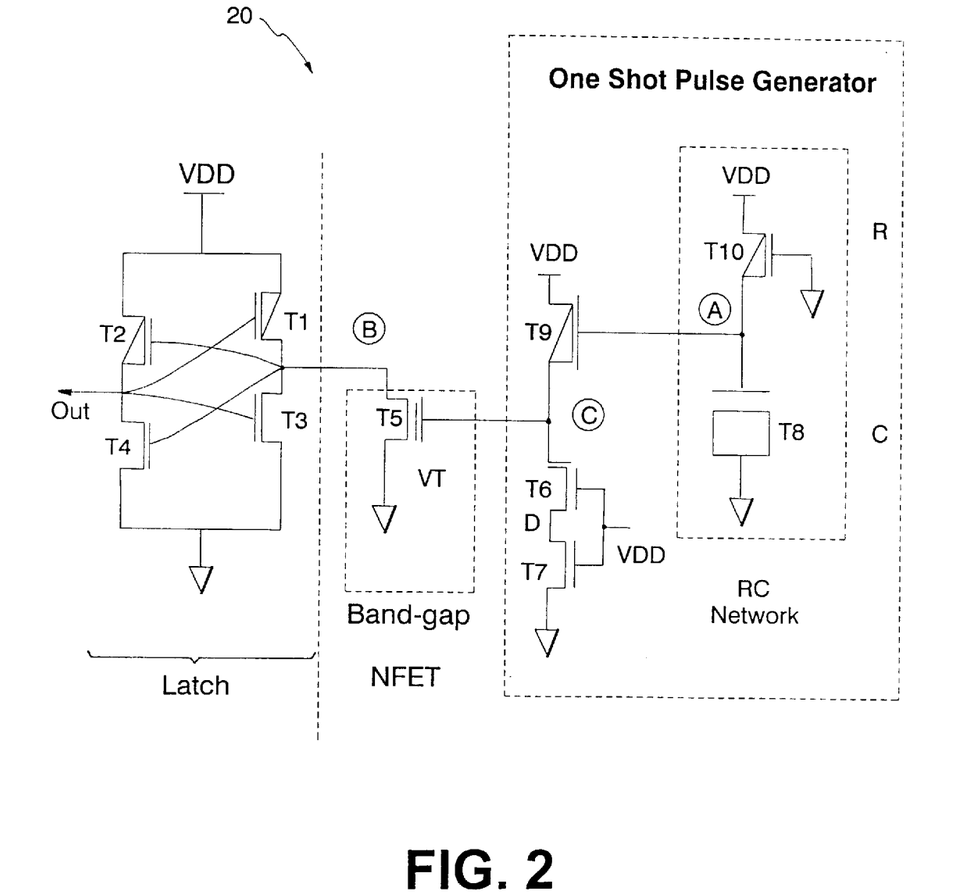
FIG. 2 shows a sensing circuit for reducing currents during burn-in of the integrated circuit.

Additional circuit that provides the sense function includes devices T5 to T10. T5 is a band-gap NFET device with a fixed Vt of 1.4 V. In general, any NFET with the correct, high Vt can be used for T5 (for example, an extra implant mask, or a thick-oxide device in a dual oxide technology). Devices T6 to T10 are used to provide a positive-going pulse during power up. When power supply VDD rises, node A is capacitively coupled to ground and gets charged up slowly by a small PFET T10. In the meantime, the bigger PFET T9 quickly charges node C toward VDD.

Eventually, node A will rise to VDD, shutting off the PFET T9. Node C then gets discharged to the ground through two small NFETs T6 and T7. Alternatively, these two NFETs T6 and T7 can be combined into one long NFET to prevent leakage current through T5.

Figure 3:
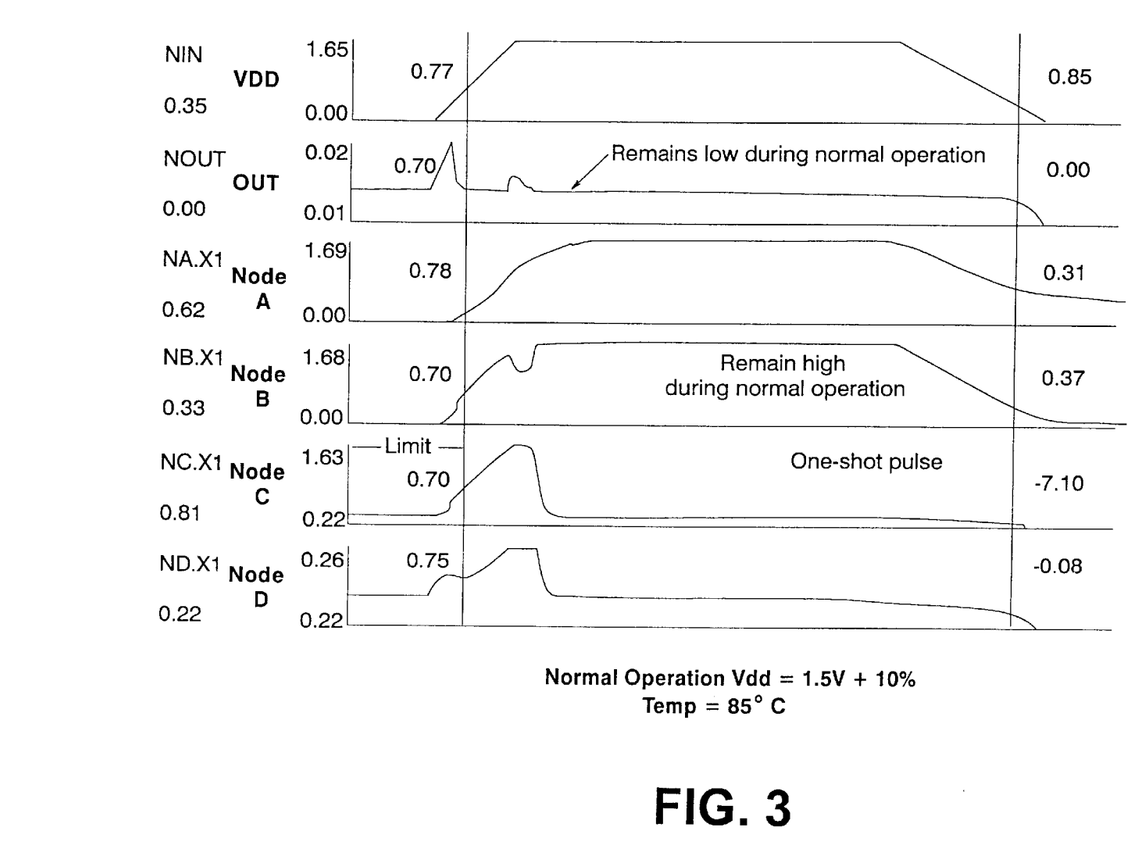
FIG. 3 shows circuit waveforms for normal operating conditions of the integrated circuit.
Figure 4:
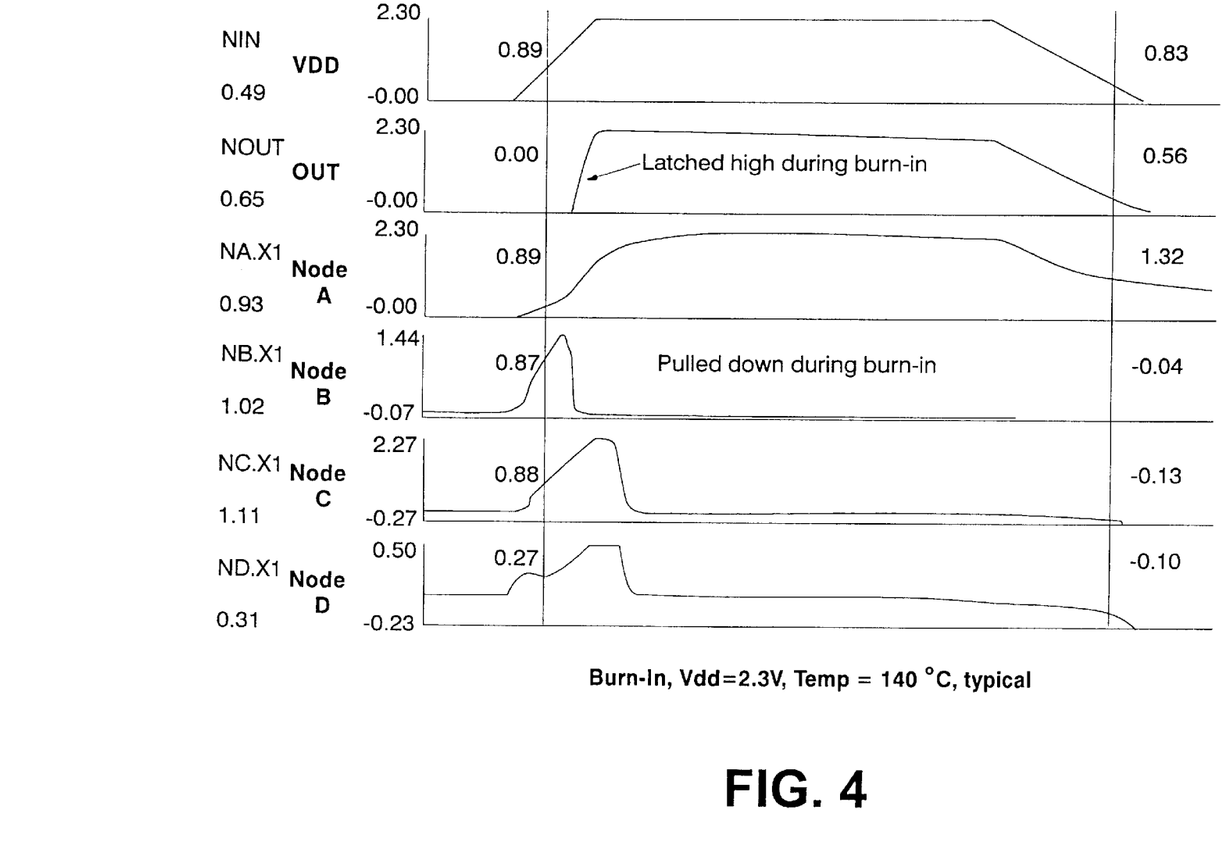
FIG. 4 shows circuit waveforms for burn-in conditions of the integrated circuit.

During normal operation, where VDD is at 1.5 V, node B is high. The pulse voltage at node C is not high enough to turn T5 on hard to fight the PFET T1. However, during burn-in, when VDD burn-in =VDD×1.5, the band-gap NFET is turned on enough to flip the latch making node OUT high. The circuit waveforms are shown in FIGS. 3 and 4 for normal and burn-in conditions. Node OUT can now be used as the control signal $V_c$ to turn off high-current circuits.

Figure 5:
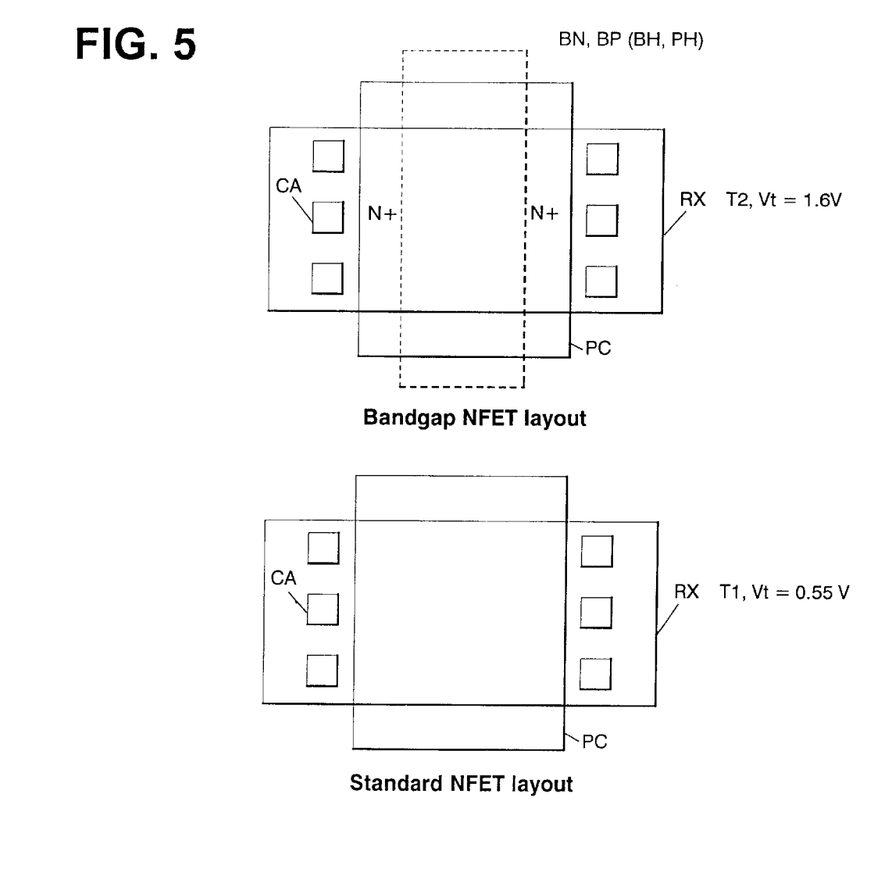
FIG. 5 illustrates a band gap device that may be used in the circuit of FIG. 2.

As mentioned above, any suitable NFET band-gap device may be used in the practice of this invention. There have been previous bandgap devices such as that described in U.S. Pat. Nos. 4,745,079 and 4,714,519. Also, bandgap devices have been used on many circuit applications such as that in U.S. Pat. No. 5,635,869. FIG. 5 illustrates a different and preferred band gap device. Device comprises a pair of MOSFETs built with mixed gate polarity to provide the band-gap reference in a dual-doped polygate process, where the doping of the gates is accomplished by the source/drain implants. More specifically, two n-MOSFETs are shown in mask levels as used in CMOS 5x. The first MOSFET, T1, is just a conventional long-channel n-MOSFET with $V_T$=0.55V. The second transistor, T2, is also an n-MOSFET, however the source/drain implant masks, BP, BN, have been drawn so as to allow the source/drain regions to remain N+doped while doping the bulk of the gate electrode to p-type. Provided that the gate length is greater than the dopant interdiffusion length, T2 can be described as three transistors in series as follows. From the source edge and the drain edge of channel to the transition in gate-electrode doping, the $V_T$ is the normal (e.g. 0.55V) threshold voltage. The third section, the center region, has P+ poly and will have a $V_T$ that is higher by a band gap, $V_T$=1.6V. Since all three portions of the channel must be inverted to achieve conduction, the effective $V_T$ of the MOSFET is that of the center section of the channel, or a bandgap above the normal $V_T$.

Figure 6:
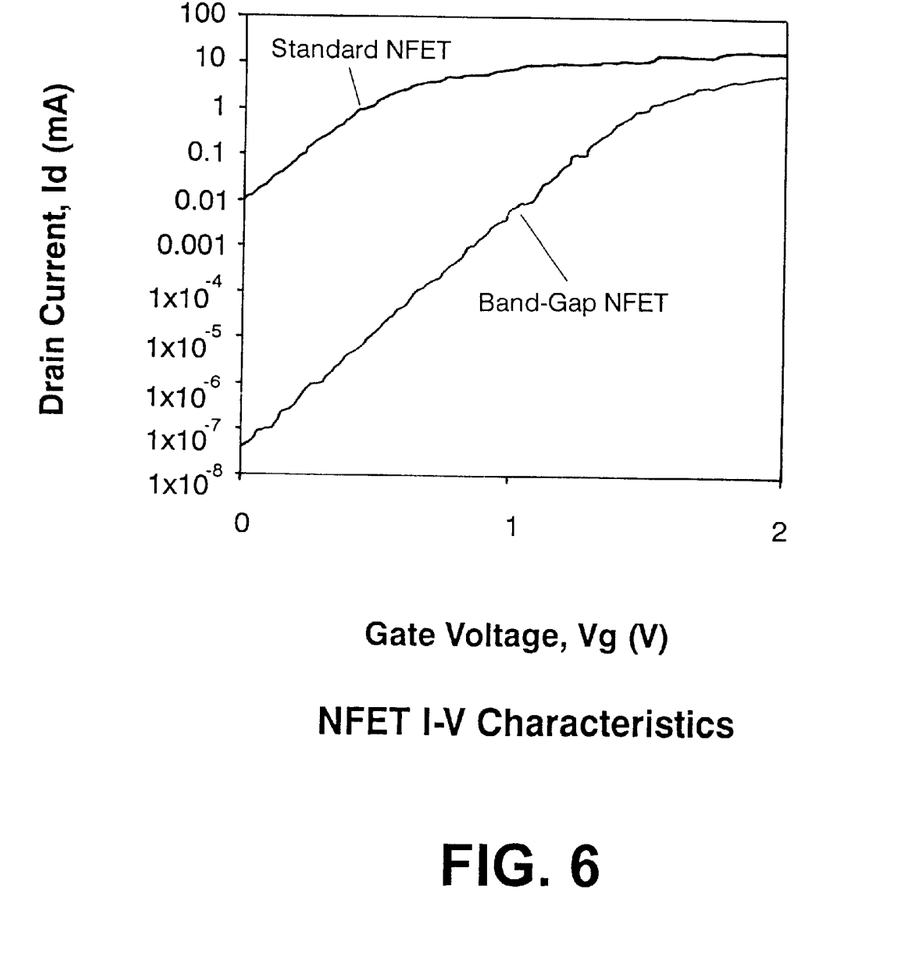
FIG. 6 shows the MOSFET characteristics of the device of FIG. 5.

The described devices have been built in CMOS 5s (standard) technology with channel lengths of 2 μm and 10 μm in both n-type and p-type MOSFETS. FIG. 5 shows the actual design-level layouts and FIG. 6 shows the resulting MOSFET characteristic Mask levels BN, BP, PH, and BH were all designed as indicated; only the BN and BP levels are necessary in CMOS 5x (and 5s actually). BP are positive masks and BN negative, i.e. implants are blocked where shapes are drawn by BP and BH while implants are admitted where BN and PH shapes are drawn. N+ implants are done with BP resist and P+ with BN resist in the CMOS 5 processes.

The $V_T$ differences generated are about 1.05V at T=22C which is reasonably close to the published value for $E_{gap}$ for silicon (1.12V @ 300K).

Figure 7:
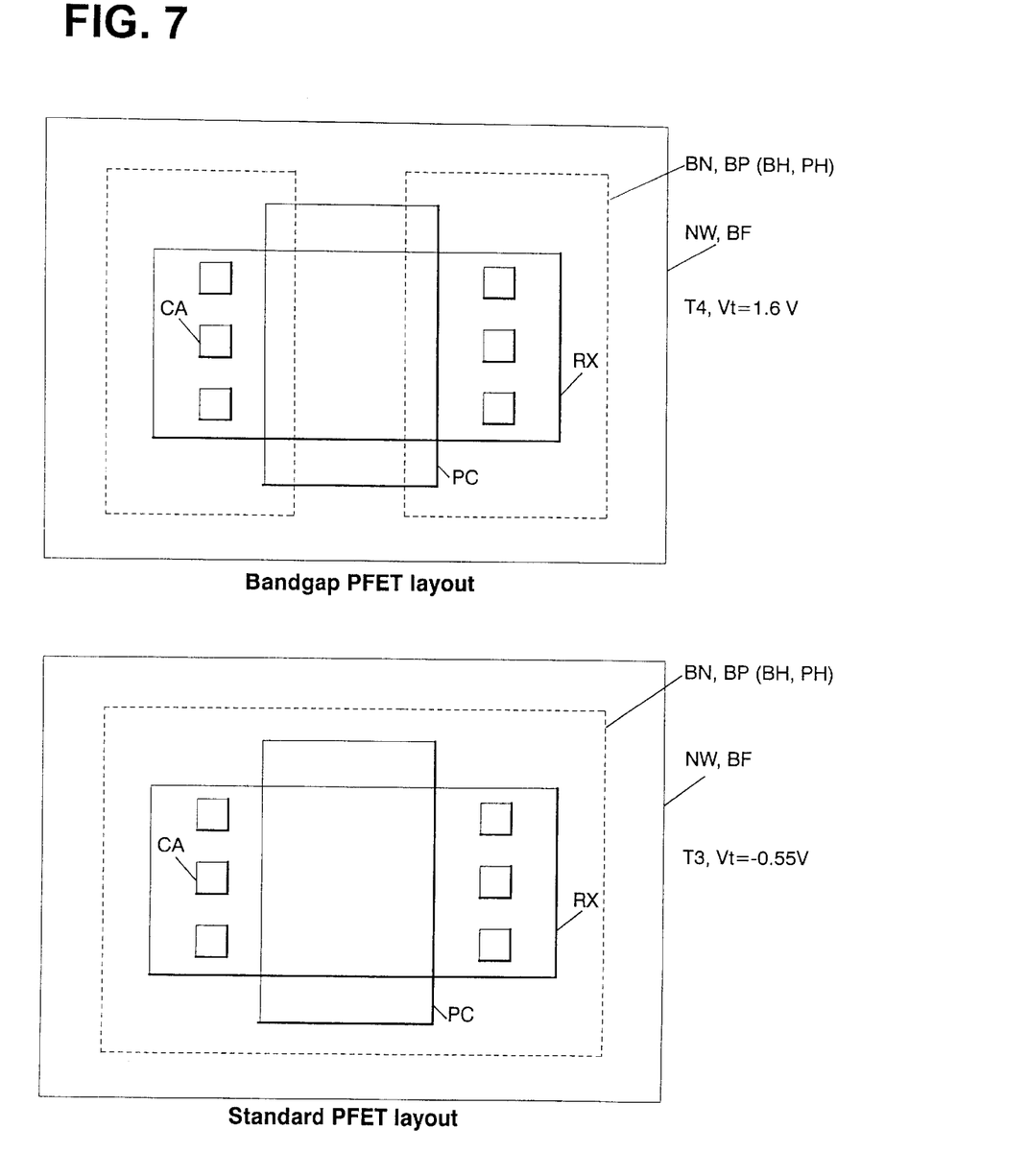
FIGS. 7 and 8, respectively, show the layout for a p-FET band-gap pair of MOSFETs and the experimental characteristics obtained.
Figure 8:
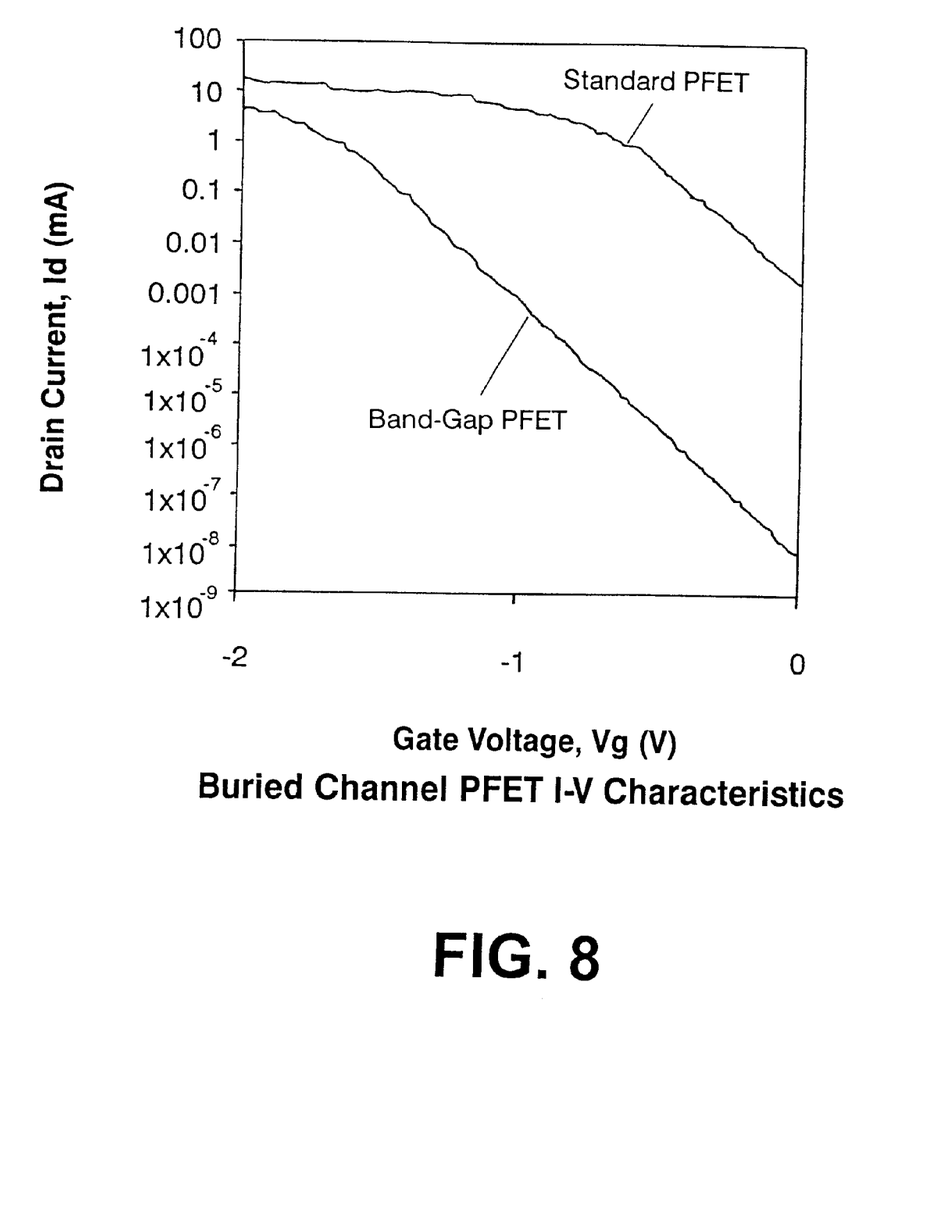

The bandgap regulator is most effective in the p-type MOSFET version since in BTV technologies the n-well can be electrically connected to the source of the p-FETs, thus eliminating $V_T$ differences due to body effect in circuits. FIGS. 7 and 8, respectively, show the layout for a p-FET band-gap pair of MOSFETs and the experimental characteristics obtained.

Figure 9:
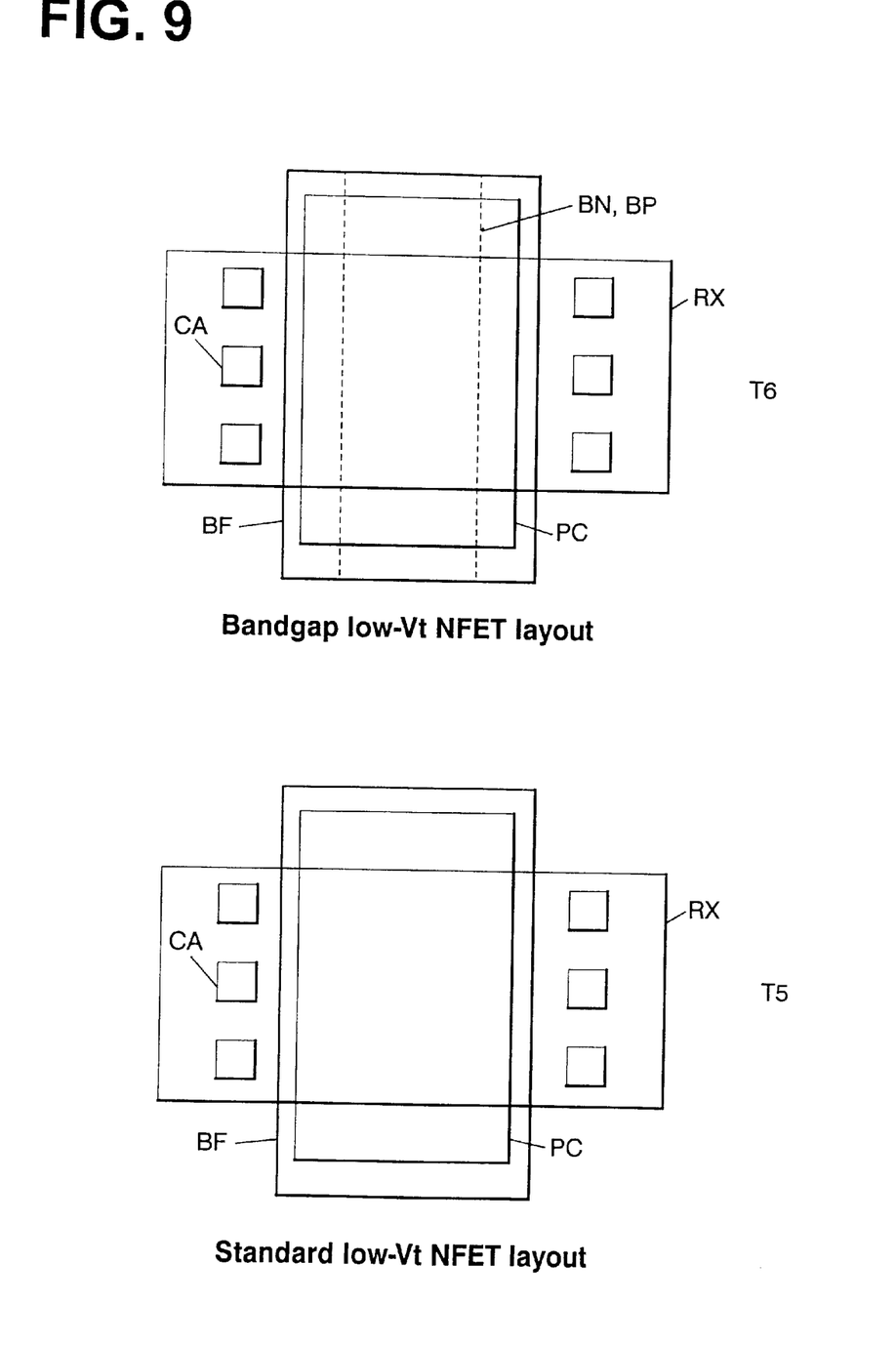
FIGS. 9 and 10 show the design data and the experimental transfer characteristics of a modified MOSFET.
Figure 10:
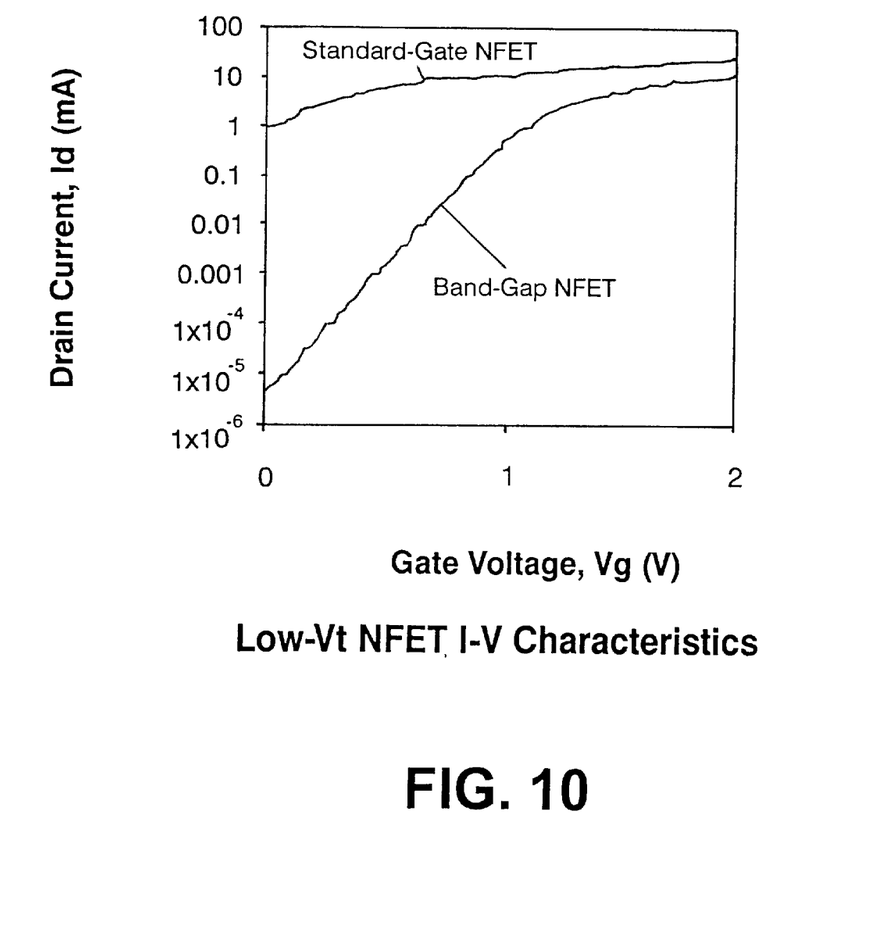

A zero-$V_T$ n-type MOSFET is available by blocking addition of a BF (P-well) block mask over a (sufficiently long) n-MOSFET. The p-epi results in a $V_T$ of roughly –0.1V and very low body effect of $V_T$ on this n-MOSFET. FIG. 9 shows the design data and FIG. 10 the experimental transfer characteristic of these MOSFETs. The low body effect on $V_T$ as well as the low $V_T$ make these n-MOSFETs very attractive for analog circuit applications, including current and voltage regulators.

Figure 11:
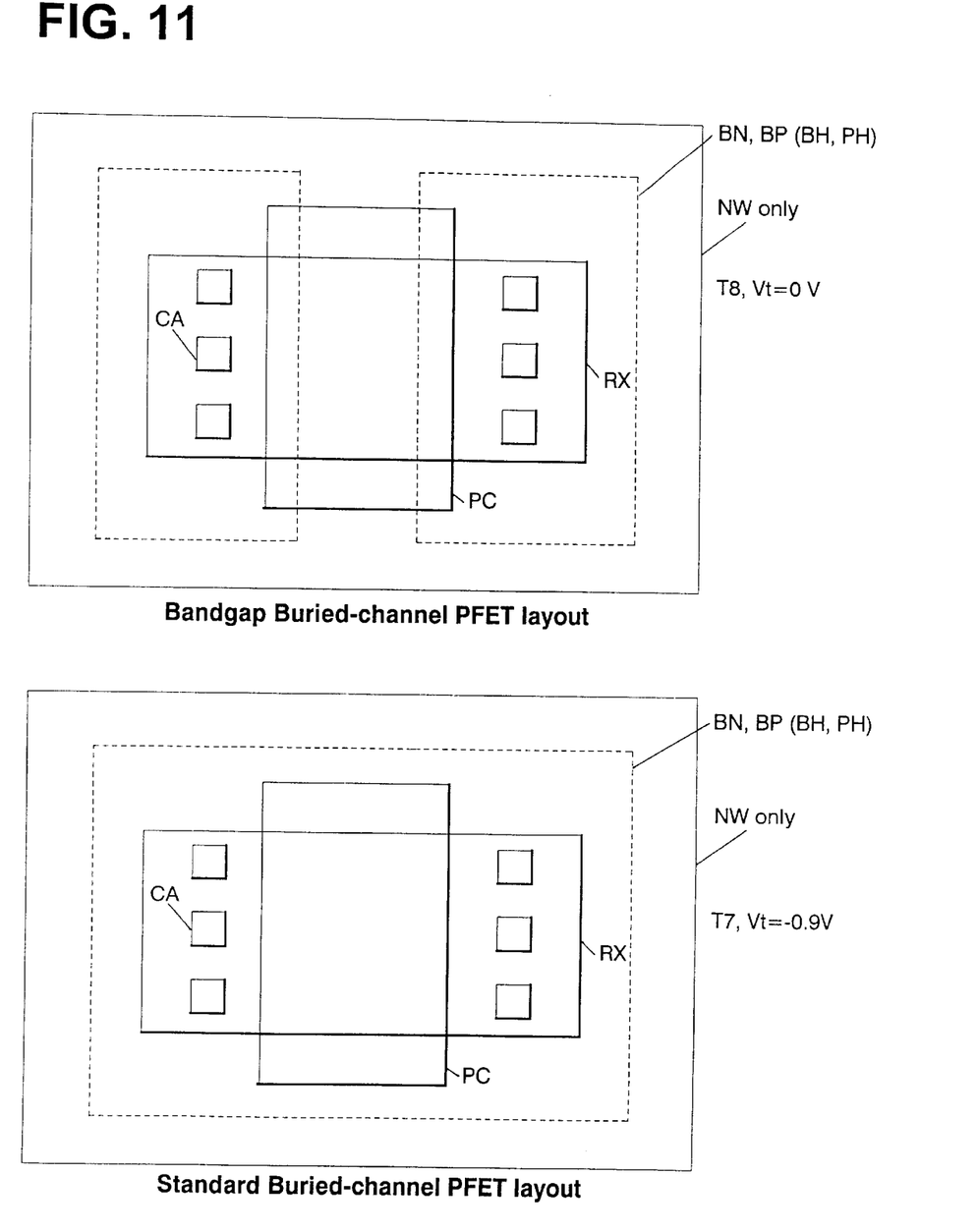
FIGS. 11 and 12, respectively, show an alternate P-type MOSFET that may be used as the band-gap device and the experimental characteristics obtained.
Figure 12:
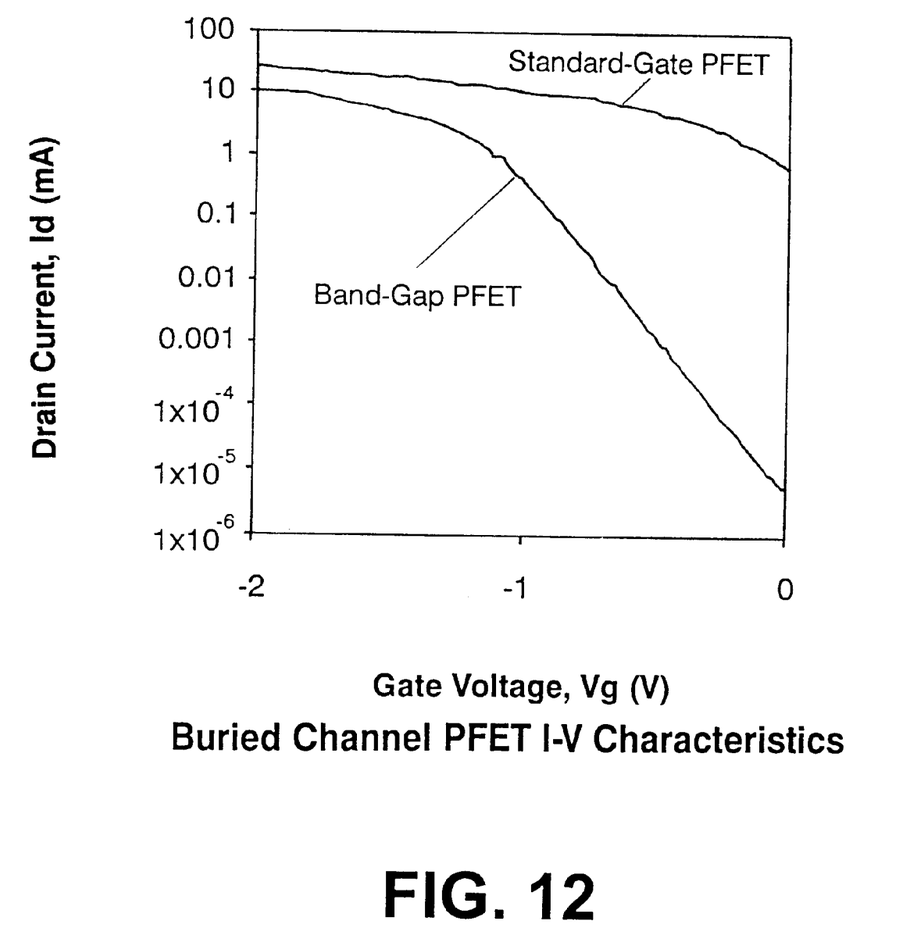

An alternate embodiment is shown in FIG. 11. Here the design data for a buried-channel P-type MOSFET in CMOS 5 is shown. Introduction of the p-well implants into the en-well results in such a device with $V_T$ around –0.9V. Again the bandgap mask layout described above is used to allow a second buried-channel p-MOSFET with $V_T$ a bandgap more positive, with $V_T$ nearby )V. This forms a useful p-MOSFET load for analog applications. FIG. 12 gives experimental results from these devices.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

Having thus described our invention, what we claim as new, and desire to secure by Letters Patent is:

1. A method of processing an integrated circuit comprising a first logic portion and a second circuit portion, wherein said second circuit portion has an adjustable standby current, the method comprising:

providing the integrated circuit with a third circuit portion for sensing voltages applied to the integrated circuit;

applying a given voltage to the integrated circuit, during a burn-in procedure, to accelerate and test for any failures in the first logic portion of the integrated circuit, wherein the standby current through the second circuit portion tends to impede said acceleration of, and tends to mask, failures in the first logic portion;

using the third circuit portion to sense the application of the given voltage to the integrated circuit, and, in response, to generate a signal; and applying said signal to the second circuit portion to reduce the standby current therethrough and thereby to improve the effectiveness of the burn-in procedure at accelerating and identifying failures in the first logic portion of the integrated circuit.

2. A method according to claim 1, wherein:

the third circuit portion includes a sensing subcircuit and a latch; and the step of using the third circuit portion to sense the application of the given voltage includes the steps of
  i) using the sensing subcircuit to sense the application of the given voltage, and, in response, to generate a subcircuit signal and to apply the subcircuit signal to the latch, and ii) using the latch to generate the given signal in response to the application of the subcircuit signal from the sensing subcircuit and to apply the given signal to the second circuit portion.

3. A method according to claim 2, wherein:

the step of applying the given voltage to the integrated circuit includes the steps of i) applying the given voltage to a first node of the sensing subcircuit, and ii) gradually charging the first node to the voltage of the given voltage; and the step of using the sensing subcircuit to sense the application of the given voltage and to generate a subcircuit signal includes the step of generating the subcircuit signal when the voltage of the first node becomes equal to the given voltage.

4. A method according to claim 1, wherein the step of using the third circuit portion to generate the given signal includes the step of using the third circuit portion to generate the given signal when the given voltage exceeds a predefined voltage level by a given amount.

5. An integrated circuit comprising:

a first logic portion;

a second circuit portion having an adjustable standby current; and a third circuit portion for sensing voltages applied to the integrated circuit;

wherein when a given voltage is applied to the integrated circuit, during a burn-in procedure, to accelerate and test for any failures in the logic portion of the integrated circuit, the standby current through the second circuit portion tends to impede said acceleration of, and tend to mask, failures in the first logic portion; and wherein the third circuit portion senses the application of the given voltage to the integrated circuit and, in response, generates a given signal and applies said signal to the second circuit portion to reduce the standby current therethrough and thereby to improve the effectiveness of the burn-in procedure at accelerating and identifying failures in the first logic portion of the integrated circuit.

6. An integrated circuit according to claim 5, wherein:

the third circuit portion includes a latch and a sensing subcircuit;

the sensing subcircuit senses the application of the given voltage and, in response, generates a subcircuit signal and applies said subcircuit signal to the latch; and the latch, in response to receiving said subcircuit signal, applies the given signal to the second circuit portion.

7. An integrated circuit according to claim 6, wherein:

the sensing subcircuit includes a first node and means for gradually charging the first node to the given voltage; and the sensing subcircuit generates the subcircuit signal when the voltage level of the first node reaches the voltage level of the given voltage.

8. An integrated circuit according to claim 5, wherein the third circuit portion generates the given signal when the given voltage exceeds a predefined voltage level by a given amount.

9. A control circuit for improving the effectiveness of a burn-in procedure applied to an integrated circuit including a first logic portion and a second circuit portion, wherein said second circuit portion has all adjustable standby current, and wherein during a burn-in procedure, a given voltage is applied to the integrated circuit to accelerate and test for any failures in the first logic portion of the integrated circuit and the standby current through the second circuit portion tends to impede said acceleration of, and tends to mask, failures in the first logic portion, the control circuit comprising:

a sensing subcircuit to sense the application of the given voltage to the integrated circuit and, in response, to generate a subcircuit signal; and a latch for receiving the subcircuit signal from the sensing subcircuit and, in response, to apply a given signal to the second circuit portion of the integrated circuit to reduce the standby current therethrough and thereby to improve the effectiveness of the burn-in procedure at accelerating and identifying failures in the first logic portion of the integrated circuit.

10. A control circuit according to claim 9, wherein:

the sensing subcircuit includes a first node and means for gradually increasing the voltage of the first node during the burn-in procedure; and the sensing subcircuit generates said subcircuit signal when the voltage of the first node reaches the given voltage.

11. A control circuit according to claim 10, wherein the sensing subcircuit generates the subcircuit signal when the voltage of the first node exceeds a predefined voltage level by a given amount.

12. A control circuit according to claim 11, wherein the control circuit is an integral portion of the integrated circuit.

* * * * *